(12) United States Patent
Kasahara et al.

(10) Patent No.: US 11,699,986 B2
(45) Date of Patent: Jul. 11, 2023

(54) OSCILLATOR AND METHOD OF MANUFACTURING SAME

(71) Applicant: Seiko Epson Corporation, Tokyo (JP)

(72) Inventors: Shoichiro Kasahara, Minowa (JP); Shinya Aoki, Minowa (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/533,340

(22) Filed: Nov. 23, 2021

(65) Prior Publication Data

US 2022/0166404 A1 May 26, 2022

(30) Foreign Application Priority Data

Nov. 24, 2020 (JP) .................. 2020-194210

(51) Int. Cl.
*H03H 9/17* (2006.01)
*H03H 3/007* (2006.01)
*H03H 9/13* (2006.01)
*H03B 5/32* (2006.01)

(52) U.S. Cl.
CPC .............. *H03H 9/17* (2013.01); *H03B 5/32* (2013.01); *H03H 3/007* (2013.01); *H03H 9/13* (2013.01)

(58) Field of Classification Search
CPC .......... H03H 9/17; H03H 9/13; H03H 9/0547; H03H 9/19; H03H 3/007; H03H 3/02; H03B 5/32
See application file for complete search history.

(56) References Cited

U.S. PATENT DOCUMENTS

2018/0097476 A1* 4/2018 Aoki .................. H01L 41/0472
2019/0212145 A1* 7/2019 Kiya .................. H03H 9/0552
2019/0267941 A1* 8/2019 Obata .................... H03L 1/028

FOREIGN PATENT DOCUMENTS

JP 2011-055033 A 3/2011

* cited by examiner

*Primary Examiner* — Jeffrey M Shin
(74) *Attorney, Agent, or Firm* — Harness, Dickey & Pierce, P.L.C.

(57) ABSTRACT

An oscillator includes a package having a plurality of external terminals disposed on a mounting surface, a circuit element housed in the package, and a resonator which is housed in the package, and is electrically coupled to the circuit element, wherein the circuit element is electrically coupled to the package with a plurality of pads each of which is bonded to the package via a bump member, the circuit element overlaps at least one of the external terminals in a plan view, and each of the bump members is bonded to the package at a position where at least a part of the bump member does not overlap the plurality of external terminals in the plan view.

10 Claims, 8 Drawing Sheets

OSCILLATOR AND METHOD OF MANUFACTURING SAME

The present application is based on, and claims priority from JP Application Serial Number 2020-194210, filed Nov. 24, 2020, the disclosure of which is hereby incorporated by reference herein in its entirety.

BACKGROUND

1. Technical Field

The present disclosure relates to an oscillator and a method of manufacturing the oscillator.

2. Related Art

There exists an oscillator having a configuration in which an IC is mounted on a package made of a material such as ceramics with an FCB (flip chip bonding) process. In JP-A-2011-055033 (Document 1), there is disclosed an oscillator having such a structure, and a configuration in which external terminals and pads of the IC do not overlap each other in a plan view.

When reducing the size of the oscillator having such a structure as described in Document 1, a distance between the external terminals of the package decreases. When simply decreasing the distance between the external terminals, it is conceivable that a part of the pad of the IC overlaps the external terminal.

However, in the oscillator, the thickness of the package differs depending on whether the external terminal is located on a reverse surface. Therefore, on the mounting surface of the package for the IC, a height difference occurs between the mounting positions of the plurality of pads of the IC. Thus, there is a problem that unevenness occurs in the pressure applied at the positions of the plurality of pads of the IC when bonding the IC and the package to each other using the FCB, and there is a possibility that the performance of the IC deteriorates.

SUMMARY

In view of the problems described above, an oscillator according to the present disclosure includes a package having a plurality of external terminals disposed on a mounting surface, a circuit element housed in the package, and a resonator which is housed in the package, and is electrically coupled to the circuit element, wherein the circuit element is electrically coupled to the package with a plurality of pads each of which is bonded to the package via a bump member, the circuit element overlaps at least one of the external terminals in a plan view, and each of the bump members is bonded to the package at a position where at least a part of the bump member does not overlap the plurality of external terminals in the plan view.

DESCRIPTION OF EXEMPLARY EMBODIMENTS

Here, some embodiments of the present disclosure will be described in the following order.
(1) First Embodiment:
(1-1) Configuration of Oscillator:
(1-2) Method of Manufacturing Oscillator:
(2) Second Embodiment:
(2-1) Configuration of Oscillator:
(2-2) Method of Manufacturing Oscillator:
(3) Third Embodiment:
(4) Other Embodiments:

(1) First Embodiment (1-1) Configuration of Oscillator:

A configuration of an oscillator 1 according to the first embodiment will be described using FIG. 1 and FIG. 2. For the sake of convenience of explanation, it is assumed that the oscillator 1 is disposed on an XYZ coordinate system constituted by an X axis, a Y axis, and a Z axis as three axes perpendicular to each other. The oscillator 1 is disposed so that a height direction becomes parallel to the Z axis setting a mounting surface which is a surface used for coupling to an external board as a bottom part. The oscillator 1 forms a rectangular shape in the plan view, and is disposed so that the long side direction of the rectangular shape becomes parallel to the X axis, and the short side direction thereof becomes parallel to the Y axis. In the X axis, a tip side of the arrow is defined as right or a right side, and a base end side thereof is defined as left or a left side. In the Y axis, a tip side of the arrow is defined as a back side, and a base end side thereof is referred to as a front side. In the Z axis, a tip side of the arrow is referred to as an upper side, and a base end side thereof is defined as a bottom or a lower side.

Figure 1:
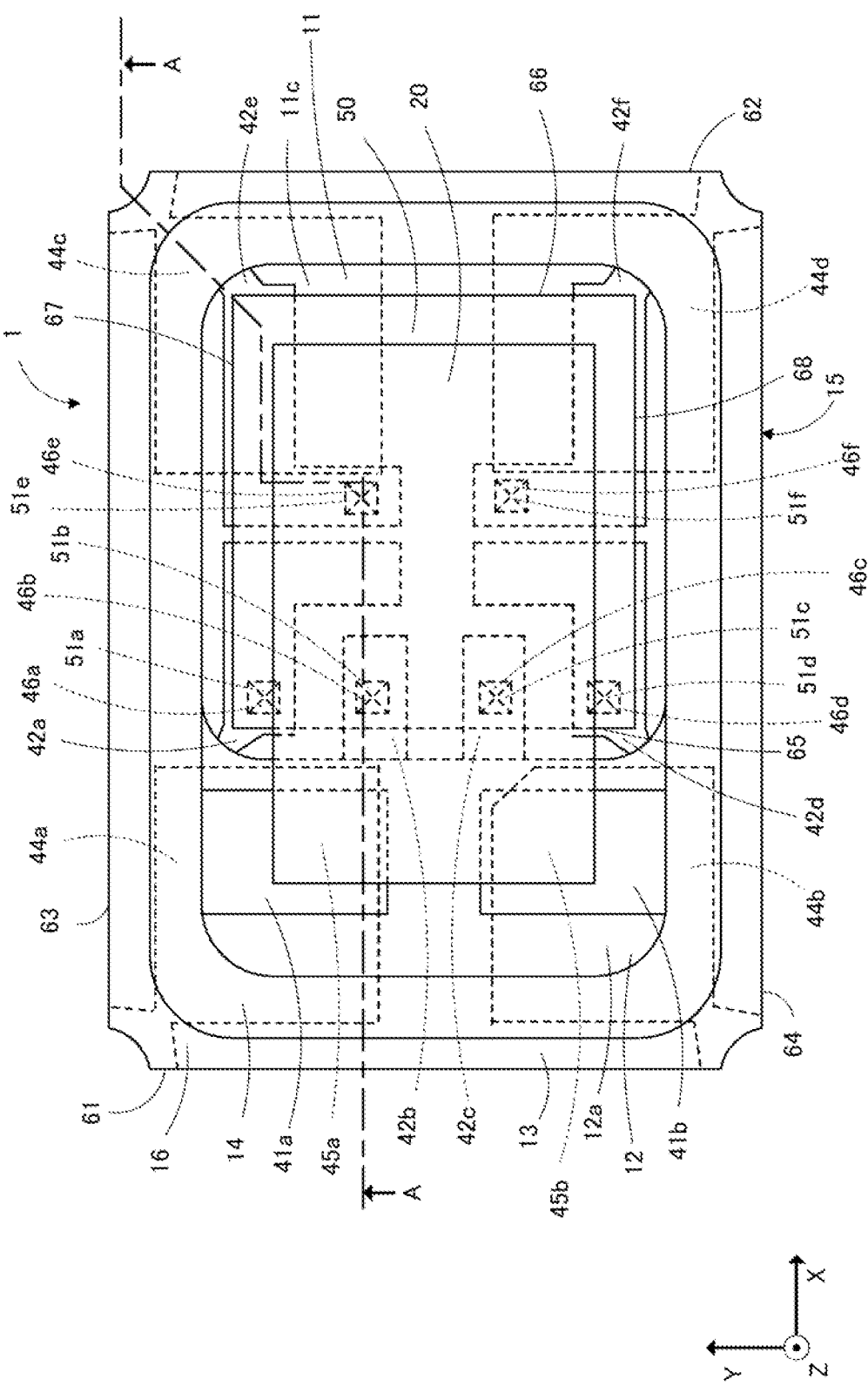
FIG. 1 is a see-through plan view of an oscillator.

FIG. 1 is a see-through plan view of the oscillator 1 viewed from above. A drawing in a plan view of an object viewed from above is hereinafter referred to as a plan view. FIG. 2 is a cross-sectional view of the oscillator 1 shown in FIG. 1 along the line A-A.

The oscillator 1 according to the present embodiment is provided with a container 10, a resonator 20, and an IC 50.

The container 10 is provided with a package 15 and a lid 16. The package 15 is a chassis for housing the resonator 20 and the IC 50. The lid 16 is a lid body which is made of metal and covers an upper surface of the package 15. The plan view shown in FIG. 1 is a plan view of the oscillator 1 seen through the lid 16.

As shown in FIG. 1, the package 15 has a rectangular shape having a first side 61 as a side at the left side, a second side 62 as an opposite side to the first side 61, a third side 63 as a side in an end portion at the back side, and a fourth side 64 as an opposite side to the third side 63 in the plan view.

The resonator 20 is a resonator element using a quartz crystal substrate as a piezoelectric body.

The IC 50 is an integrated circuit element (Integrated Circuit) shaped like a rectangular plate, and is provided with a plurality of pads 51*a* through 51*f* used for electrical coupling to the package 15 on one surface. Hereinafter, the pads 51*a* through 51*f* are arbitrarily referred to collectively as pads 51.

As shown in FIG. 1, the IC 50 has a rectangular shape having a fifth side 65 as a left end side located beside the first side 61, a sixth side 66 which is an opposite side to the fifth side 65, and is farther from the first side 61 than the fifth side 65, a seventh side 67 as a side in an end portion at the back side, and an eighth side 68 as an opposite side to the seventh side 67 in the plan view.

A distance (a distance in the X-axis direction) between the first side 61 and the fifth side 65 is longer than a distance between the second side 62 and the sixth side 66.

The pad 51*a* is a power supply pad to which a power supply voltage is applied. Further, the pad 51*b* is a first resonator pad to electrically be coupled to the resonator 20. Further, the pad 51*c* is a second resonator pad to electrically be coupled to the resonator 20. Further, the pad 51*d* is a control pad to which an output control signal for a clock signal is input.

Further, the pad 51*e* is a ground pad to be supplied with a ground potential. Further, the pad 51*f* is an output pad for outputting the clock signal.

Further, a pad group of the pads 51*a* through 51*d* is disposed along the fifth side 65 so as to be closer to the fifth side 65 than to the sixth side 66. The pad group disposed along the fifth side 65 so as to be closer to the fifth side 65 than to the sixth side 66 is defined as a first pad group. The pads 51*a* through 51*d* are disposed at positions the same in the X-axis direction. It should be noted that the pads 51 in the first pad group can be disposed at positions different in the X-axis direction from each other. Further, some of the pads in the first pad group can be disposed at positions the same in the X-axis direction.

Further, a pad group of the pads 51*e* and 51*f* is disposed along the sixth side 66 so as to be closer to the sixth side 66 than to the fifth side 65. The pad group disposed along the sixth side 66 so as to be closer to the sixth side 66 than to the fifth side 65 is defined as a second pad group. The pads 51*e* and 51*f* are disposed at positions the same in the X-axis direction. It should be noted that the pads 51 in the second pad group can be disposed at positions different in the X-axis direction from each other. Further, some of the pads in the second pad group can be disposed at positions the same in the X-axis direction.

In the present embodiment, a distance on the X axis between the sixth side 66 and the second pad group is longer than a distance on the X axis between the fifth side 65 and the first pad group. In other words, the second pad group is disposed closer to the center of the IC 50 in the X-axis direction than the first pad group.

Figure 2:
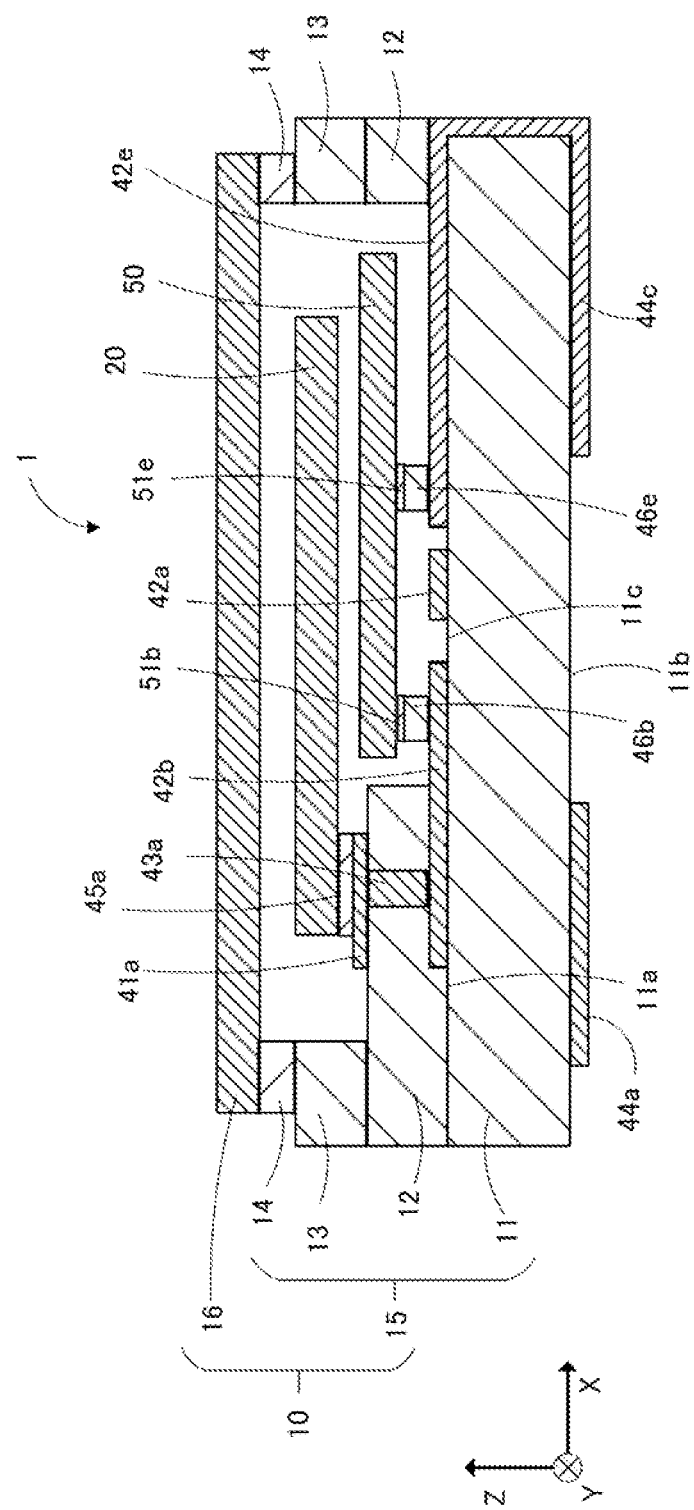
FIG. 2 is a cross-sectional view of the oscillator.
Figure 3:
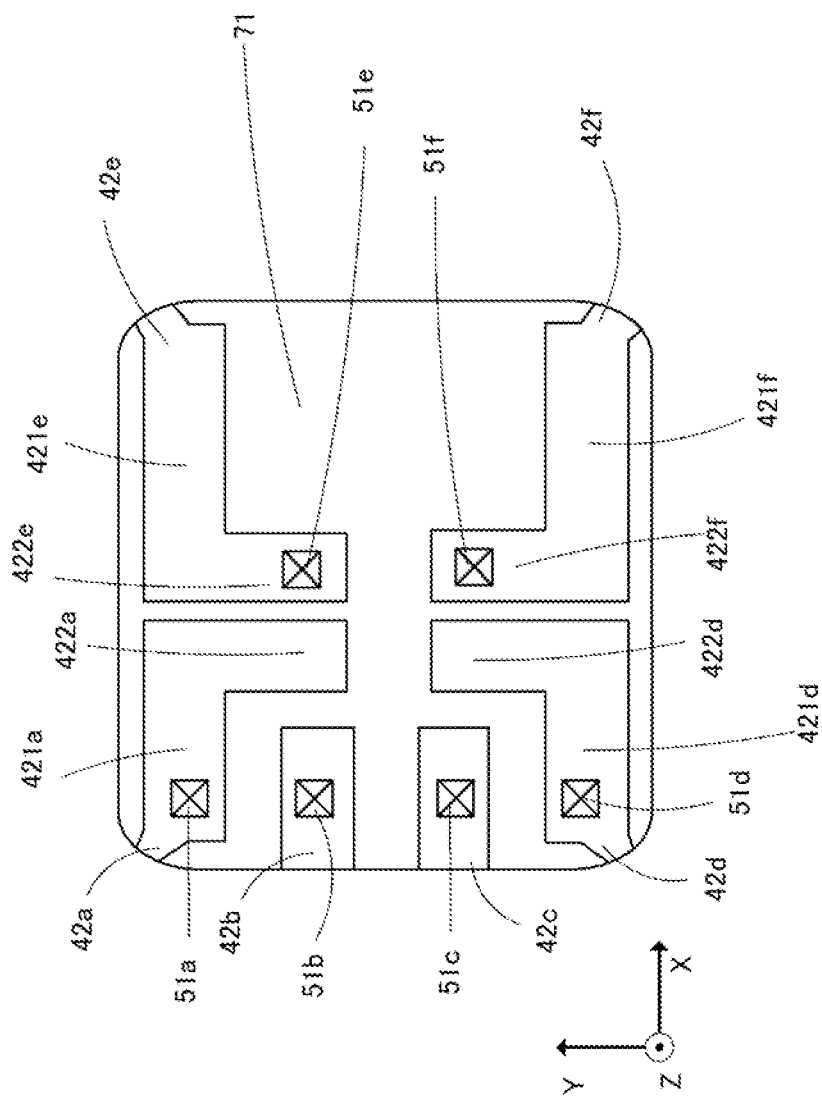
FIG. 3 is a plan view of an IC arrangement surface.

As shown in FIG. 1 and FIG. 2, the package 15 is provided with a substrate 11 forming a bottom part of the package 15, a first frame body 12 as a frame body forming a housing space for the IC 50 and a support base for the resonator 20, a second frame body 13 as a frame body forming a housing space for the resonator 20, and a seam ring 14 as a bonding member to the lid 16. Further, the package 15 is provided with a plurality of coupling interconnections 41*a*, 41*b* to be used for coupling to the resonator 20, a plurality of coupling interconnections 42*a* through 42*f* to be used for coupling to the IC 50, a via hole 43*a* to be used for coupling between the coupling interconnection 41*a* and the coupling interconnection 42*b*, a via hole 43*b* not shown to be used for coupling between the coupling interconnection 41*b* and the coupling interconnection 42*c*, and a plurality of external terminals 44*a* through 44*d* to be used for coupling to the external board. Hereinafter, the coupling interconnections 41*a*, 41*b* are arbitrarily referred to collectively as coupling interconnections 41. Further, hereinafter, the coupling interconnections 42*a* through 42*f* are arbitrarily referred to collectively as coupling interconnections 42. Further, hereinafter, the via holes 43*a*, 43*b* are arbitrarily referred to collectively as via holes 43. Further, hereinafter, the external terminals 44*a* through 44*d* are arbitrarily referred to collectively as external terminals 44.

The coupling interconnections 41*a*, 41*b* and the resonator 20 are bonded to each other via the bump members 45*a*, 45*b*, respectively. As shown in FIG. 2, the bump member 45*a* is located between the coupling interconnection 41*a* and the resonator 20. Similarly, the bump member 45*b* is located between the coupling interconnection 41*b* and the resonator 20. Hereinafter, the bump members 45*a*, 45*b* are arbitrarily referred to collectively as bump members 45. The coupling interconnections 42*a* through 42*f* and the pads 51*a* through 51*f* of the IC 50 are bonded to each other via the bump members 46*a* through 46*f*, respectively. Hereinafter, the bump members 46*a*, 46*b* are arbitrarily referred to collectively as bump members 46.

In the substrate 11, a surface at an obverse side is defined as a first surface 11*a*, and an opposite surface to the first surface 11*a* to be a surface at a reverse side is defined as a second surface 11*b*. In the present embodiment, the substrate 11 is a substrate made of ceramics. The substrate 11 can be a substrate made of a substrate material having an insulating property such as glass or resin, or a substrate material having an insulating property obtained by combining these materials.

On the four corners of the second surface 11*b* as a bottom surface of the substrate 11, there are disposed the external terminals 44*a* through 44*d*, respectively. The external terminals 44*a* through 44*d* are disposed respectively on an upper left corner, a lower left corner, an upper right corner, and a lower right corner of the second surface 11*b* in the plan view. The external terminals 44*a* through 44*d* are each a metal member provided with a portion shaped like a plate having a surface parallel to an X-Y plane, and a portion extending in a height direction from the corner of the second surface 11*b* to be coupled to the coupling interconnection 42. The external terminals 44*a*, 44*c*, and 44*d* each have a shape including an area having a rectangular shape, and an area for coupling this area and a corner portion of the second surface 11*b* to each other. The external terminal 44*b* has a shape including an area having a rectangular shape in which a corner portion closer to the center of the second surface 11*b* is cut out, and an area for coupling this area and a corner portion of the second surface 11*b* to each other in the plan view. As described above, the external terminal 44*b* out of the external terminals 44*a* through 44*d* is different in shape in the plan view from the rest. Thus, it is possible for the user to visually recognize and confirm which terminal corresponds to which one of the external terminals 44*a* through 44*d*. It should be noted that providing one of the external terminals 44*a* through 44*d* has a shape which can be distinguished from the rest, it is possible to assume that the external terminals 44*a* through 44*d* have other shapes.

In the present embodiment, each of the pads 51 is disposed so as not to even partially overlap any of the external terminals 44 in the plan view in the oscillator 1.

Further, it is assumed that in the present embodiment, the package 15 reduced in size is used in the oscillator 1. Thus, the proportion of the external terminals 44 to the second surface 11*b* becomes higher than when using the package 15 not reduced is size, and as a result, the IC 50 and the external terminals 44*c*, 44*d* overlap each other in the plan view. It should be noted that it is possible for the IC 50 to have a different configuration providing the IC 50 even partially overlaps at least one of the external terminals 44 in the plan view in that configuration.

The external terminals 44a, 44b are disposed closer to the first side 61 than to the second side 62 along the first side 61. The external terminal 44a is a power supply terminal as a terminal to be supplied with the power supply voltage. The external terminal 44b is a control terminal to which a signal for controlling ON/OFF of the clock signal is applied. The external terminals 44c, 44d are disposed closer to the second side 62 than to the first side 61 along the second side 62. The external terminal 44c is an output terminal as a terminal for outputting the clock signal. The external terminal 44d is a ground terminal to be supplied with the ground potential.

On the substrate 11, there are stacked the first frame body 12 and the second frame body 13 each having a shape of a picture frame. An inner wall of a left portion of the first frame body 12 protrudes rightward from an inner wall of a left portion of the second frame body 13 to form a step. Here, the shape of a picture frame means a frame shape surrounding a rectangular solid space. A surface which is a portion surrounded by the inner wall of the first frame body 12 in the first surface 11a, and on which the IC 50 is disposed is hereinafter defined as an IC arrangement surface 11c. Since the distance between the first side 61 and the fifth side 65 is longer than the distance between the second side 62 and the sixth side 66, the IC arrangement surface 11c is disposed so as to be shifted rightward on the X axis in the plan view. Further, the external terminals 44 are disposed respectively on the four corners of the second surface 11b. Therefore, a distance between the second pad group and the external terminals 44 (44c, 44d) at the right side is shorter than a distance between the first pad group and the external terminals 44 (44a, 44b) at the left side. Therefore, the second pad group is higher in possibility of overlapping the external terminals 44 than the first pad group. On the IC arrangement surface 11c, there are disposed the coupling interconnections 42a through 42f. The coupling interconnections 42a through 42f are plate-like metal members used for coupling to the pads 51a through 51f, respectively. The coupling interconnections 42a, 42d, 42e, and 42f each have a shape obtained by combining two elongated portions in the plan view in the IC arrangement surface 11c. Further, the coupling interconnections 42b, 42c each have a rectangular shape in the plan view in the IC arrangement surface 11c. FIG. shows the coupling interconnections 42 and the pads 51 disposed on the IC arrangement surface 11c.

In the present embodiment, the coupling interconnection 42a is a power supply interconnection as an interconnection electrically coupled to the pad 51a as the power supply pad. The coupling interconnection 42a includes a first portion 421a extending rightward from the upper left corner of the IC arrangement surface 11c in the plan view, and a second portion 422a extending frontward from a right end of the first portion 421a in the plan view. The first portion 421a is a portion used for coupling between the pad 51a as the power supply pad and the external terminal 44a as the power supply terminal. Further, the second portion 422a is disposed so as to extend between the pad 51e as the output pad and the pad 51b as the first resonator pad in the plan view.

Further, the coupling interconnection 42d is a control interconnection as an interconnection electrically coupled to the pad 51d as the control pad. The coupling interconnection 42d includes a third portion 421d extending rightward from the lower left corner of the IC arrangement surface 11c in the plan view, and a fourth portion 422d extending backward from a right end of the third portion 421d. The third portion 421d is used for coupling between the pad 51d as the control pad and the external terminal 44b as the control terminal. Further, the fourth portion 422d is disposed so as to extend between the pad 51f as the ground pad and the pad 51c as the second resonator pad in the plan view.

Further, the coupling interconnections 42b, 42c are coupled to the pad 51b as the first resonator pad and the pad 51c as the second resonator pad, respectively, and each include a portion having a rectangular shape extending rightward from a left end of the IC arrangement surface 11c in the plan view. Further, the coupling interconnection 42e includes a fifth portion 421e which is coupled to the pad 51e as the output pad, and extends leftward from the upper right corner of the IC arrangement surface 11c in the plan view, and a sixth portion 422e extending frontward from a left end of the fifth portion 421e in the plan view. Further, the coupling interconnection 42f includes a seventh portion 421f which is coupled to the pad 51f as the ground pad, and extends leftward from the lower right corner of the IC arrangement surface 11c in the plan view, and an eighth portion 422f extending backward from a left end of the seventh portion 421f in the plan view.

The IC 50 is disposed in the IC arrangement surface 11c so that the surface provided with the pads 51 is opposed to the IC arrangement surface 11c, and the pads 51a through 51f respectively overlap the coupling interconnections 42a through 42f in the plan view. The pads 51a through 51f and the coupling interconnections 42a through 42f are bonded to each other via the bump members 46a through 46f as bonding members made of an electrically-conductive material such as solder, respectively, by the flip chip bonding. Since each of the pads 51 is disposed so as not to even partially overlap any of the external terminals 44 in the plan view, each of the bump members 46 is bonded to the package 15 at a position not even partially overlapping any of the external terminals 44 in the plan view.

A portion of the step formed of the first frame body 12, namely a portion which is the upper surface of the first frame body 12, and is surrounded by the inner wall of the second frame body 13, is a portion which functions as the support base for supporting the resonator 20. This portion is hereinafter referred to as a resonator support surface. At the arrangement position of the resonator 20 on the resonator support surface, there is disposed the plurality of coupling interconnections 41a, 41b to be used for coupling to the resonator 20.

The resonator 20 is electrically coupled to the coupling interconnections 41a, 41b via the bump members 45a, 45b as the bonding members made of an electrically-conductive material such as solder, and is fixed to the resonator support surface. The coupling interconnections 41a, 41b are electrically coupled to the coupling interconnections 42b, 42c via the via hole 43a and the via hole 43b not shown penetrating downward the inside of the first frame body 12, respectively.

As described above, the resonator 20 and the IC 50 are housed in a space surrounded by the IC arrangement surface 11c as a bottom, and the first frame body 12 and the second frame body 13 each shaped like a picture frame. It should be noted that the material of the first frame body 12 and the second frame body 13 is substantially the same as that of the substrate 11.

In a preferred example, the material of the lid 16 is Kovar (Fe—Ni—Co alloy), and the material of the seam ring is silver solder. The housing space formed inside the package 15 is provided with an inert gas atmosphere with an inert gas such as nitrogen, helium, or argon, or a reduced pressure atmosphere lower in pressure than the atmospheric pressure, and is sealed with the lid 16. Thus, the IC 50, the resonator 20, and so on housed in the housing space are protected against an impact, dust, heat, moisture, and so on. It should be noted that the lid 16 made of metal is grounded at the ground potential.

Figure 4:
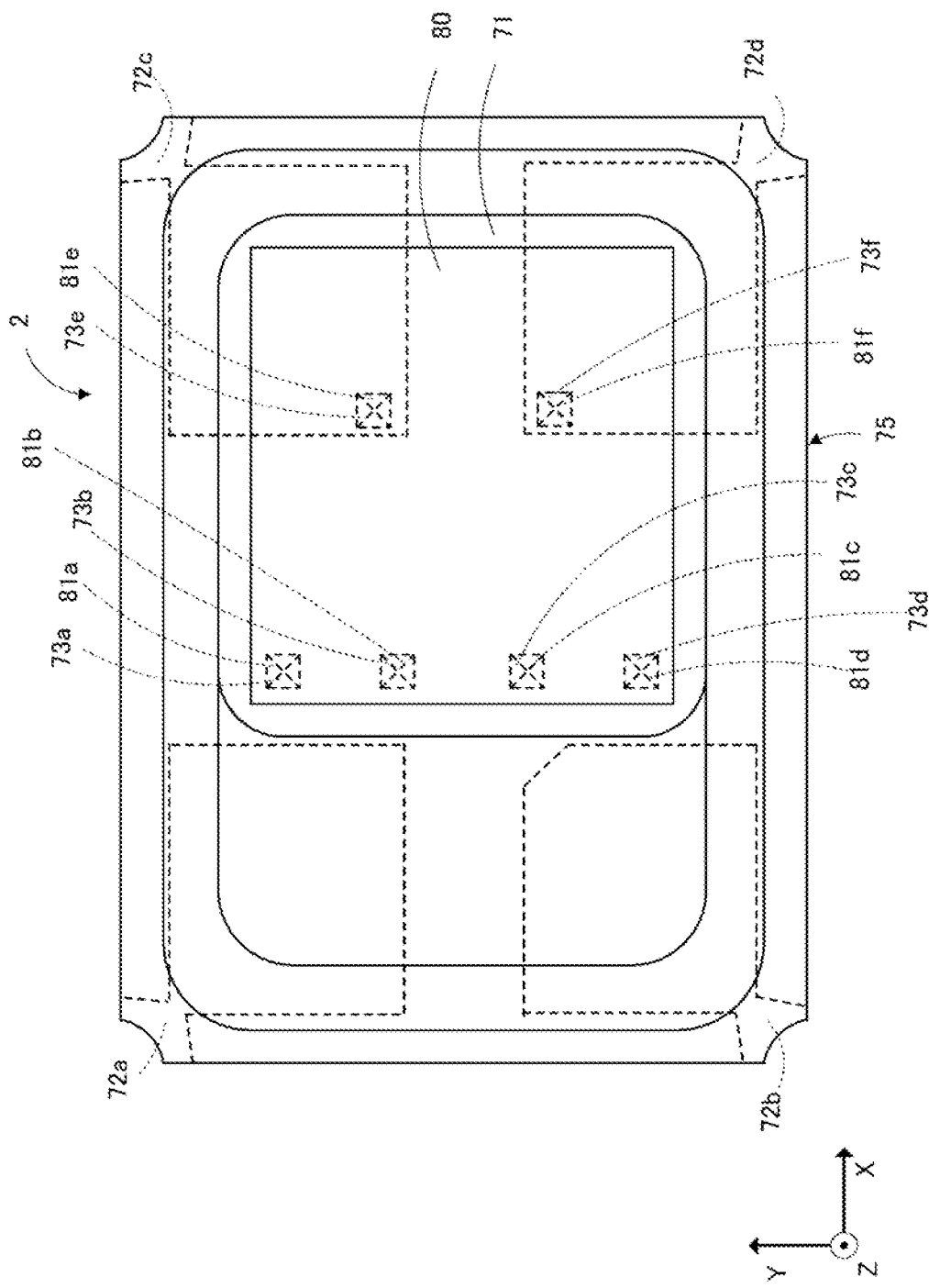
FIG. 4 is a diagram for explaining a structure of an oscillator according to a comparative example.

Here, an oscillator 2 according to a possible comparative example will be described using FIG. 4. FIG. 4 is a diagram for explaining a positional relationship between pads 81*a* through 81*f* of an IC 80 in the oscillator 2 and external terminals 72*a* through 72*d*. FIG. 4 shows the pads 81*a* through 81*f* and the external terminals 72*a* through 72*d* in the plan view in the oscillator 2. Hereinafter, the pads 81*a* through 81*f* are arbitrarily referred to collectively as pads 81. Further, the external terminals 72*a* through 72*d* are arbitrarily referred to collectively as external terminals 72.

As shown in FIG. 4, in the oscillator 2 according to the comparative example, the pads 81*a* through 81*d* do not overlap any of the external terminals 72 in the plan view similarly to the pads 51*a* through 51*d*. In contrast, the pads 81*e*, 81*f* overlap the external terminals 72*c*, 72*d*, respectively, in the plan view.

Due to an influence of disposing the external terminals 72 on the mounting surface of the oscillator 2, the thickness in the Z-axis direction of the substrate of the package differs between an area in which the external terminals 72 are located on the reverse surface and an area in which the external terminals 72 are not located on the IC arrangement surface 71 of the oscillator 2. Therefore, in the IC arrangement surface 71, there occurs a difference in height between an area overlapping the external terminals 72 and an area not overlapping the terminals 72 in the plan view. Therefore, there occurs a difference in height between the positions on the IC arrangement surface 71 at which the pads 81*a* through 81*f* are respectively located.

When mounting the IC on the package, such operations as described below will be performed. First, the bump members the same in shape are bonded respectively to the pads of the IC. Then, the surface on which the pads of the IC are disposed are made opposed to an upper part of the package, and then the IC is made closer to the IC arrangement surface of the package while keeping the mounting surface of the package and the surface of the IC parallel to each other. When the bumps provided to the pads of the IC and the corresponding coupling interconnections on the IC arrangement surface have contact with each other, by applying a load and an ultrasonic wave between the pads and the corresponding coupling interconnections, the bump members and the corresponding coupling interconnections are bonded to each other.

Figure 5:
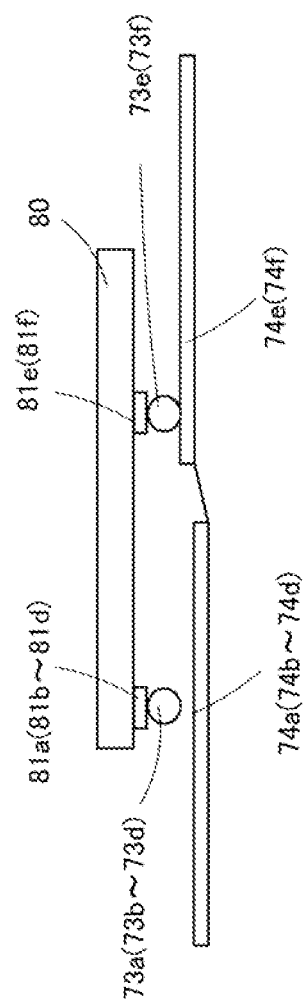
FIG. 5 is a diagram showing a condition when bonding an IC in the comparative example.

When mounting the IC 80 on the package 75 of the oscillator 2 using such operations as described above, there occurs the following. In other words, the IC 80 having the pads 81*a* through 81*f* respectively provided with the bump members 73*a* through 73*f* is made to gradually come closer to the IC arrangement surface 71 of the package 75. Hereinafter, the bump members 73*a* through 73*f* are arbitrarily referred to collectively as bump members 73. First, the bump members 73*e*, 73*f* in the pads 81*e*, 81*f* make contact with the coupling interconnections 74*e*, 74*f* on the IC arrangement surface 71 in advance of the bump members 73*a* through 73*d* in the pads 81*a* through 81*d*. FIG. 5 shows the condition of this case. Then, the IC 80 and the package 75 are made to come closer to each other while keeping the state in which the surface of the IC 80 and the mounting surface of the package 75 are parallel to each other. When all of the bump members 73*a* through 73*f* in the pads 81*a* through 81*f* and the corresponding coupling interconnections 74*a* through 74*f* make contact with each other, then the load and the ultrasonic wave are applied to the portions of the pads 81*a* through 81*f* to bond the IC 80 to the package 75. Hereinafter, the coupling interconnections 74*a* through 74*f* are arbitrarily referred to collectively as coupling interconnections 74.

In such a manner, in the portions of the pads 81*e*, 81*f*, after the bump members 73 and the corresponding coupling interconnections 74 on the IC arrangement surface 71 once make contact with each other, the IC 80 is pressed against the IC arrangement surface 71 until the bump members 73 and the coupling interconnections 74 on the IC arrangement surface 71 make contact with each other in the portions of the pads 81*a* through 81*d* as a result. Thus, higher pressure is applied to the portions of the pads 81*e* through 81*f* than the pressure applied to the portions of the pads 81*a* through 81*d*, and there occurs imbalance in pressure applied when bonding the IC 80 and the package 75 to each other using the flip chip bonding. As a result, there is a possibility that an excessive force is applied to the periphery of the pads 81*e* through 81*f* to deteriorate the performance of the IC 50.

In the oscillator 1 according to the present embodiment, the pads 51*a* through 51*f* do not even partially overlap any of the external terminals 44 in the plan view, and the bump members 46*a* through 46*f* do not even partially overlap any of the external terminals 44 in the plan view. Therefore, the arrangement positions of the pads 51*a* through 51*f* in the respective coupling interconnections 42 on the IC arrangement surface 11*c* of the package 15 are the positions at which the external terminals 44 are not located on the bottom part. Therefore, the imbalance in height of the arrangement positions of the pads 51*a* through 51*f* in the IC arrangement surface 11*c* is reduced compared to when some of the pads 51*a* through 51*f* overlap any of the external terminals 44 in the plan view. Thus, the pressure applied to the periphery of each of the pads 51*a* through 51*f* when bonding the IC 50 and the package 15 to each other using the flip chip bonding becomes more approximate to the uniform pressure. As a result, it is possible to reduce the possibility that an excessive pressure is applied to the periphery of some of the pads 51*a* through 51*f* to deteriorate the performance of the IC 50.

Further, in the present embodiment, the coupling interconnection 42*a* includes the second portion 422*a* extending between the pad 51*b* and the pad 51*e* in the plan view. The coupling interconnection 42*a* is coupled to the pad 51*a* as the power supply pad, and is supplied with a DC potential. AC signals respectively flow through the coupling interconnection 42*e* to be coupled to the pad 51*e* as the output pad and the coupling interconnection 42*b* to be coupled to the pad 51*b* as the first resonator pad. Therefore, there is a possibility that these AC signals interfere with each other to deteriorate the noise performance. In the present embodiment, the second portion 422*a* of the coupling interconnection 42*a* which exists between the coupling interconnection 42*b* and the coupling interconnection 42*e*, and which is supplied with the DC potential plays a role of a shield, and thus, it is possible to reduce the interference between these AC signals to reduce the deterioration of the noise performance.

Further, in the present embodiment, the coupling interconnection 42*d* includes the fourth portion 422*d* extending between the pad 51*c* and the pad 51*f* in the plan view. The coupling interconnection 42*d* is coupled to the pad 51*d* as the control pad, and is supplied with a DC potential as the output control signal for the clock signal. Thus, similarly to the second portion 422*a* of the coupling interconnection 42a, the fourth portion 422d of the coupling interconnection 42d plays a role of a shield between the coupling interconnection 42c and the coupling interconnection 42f to thereby reduce the interference between signals respectively flowing through the coupling interconnection 42c and the coupling interconnection 42f to reduce the deterioration of the noise performance.

(1-2) Method of Manufacturing Oscillator:

An example of a method of manufacturing the oscillator 1 will be described.

First, the bump members 46 are formed on the respective pads 51 of the IC 50 with ultrasonic bump bonding using Au fine bonding wires.

Then, a bonding step of bonding the IC 50 to the IC arrangement surface 11c of the package 15 will be described. The IC 50 is flipped, and is passed to a tip nozzle of an ultrasonic horn of a flip chip bonding apparatus. Then, using the flip chip bonding apparatus, the surface of the IC 50 on which the pads 51 are disposed is made opposed in parallel to the IC arrangement surface 11c of the package 15 disposed horizontally with the mounting surface located in the bottom part. On this occasion, it is arranged that each of the pads does not even partially overlap any of the external terminals 44 in the plan view. Thus, in the oscillator 1, each of the bump members 46 is located at a position not even partially overlapping any of the external terminals 44 in the plan view.

Then, using the flip chip bonding apparatus, the IC is moved downward to come closer to the IC arrangement surface 11c. When the bump members 46 provided to the respective pads 51 of the IC 50 make contact with the corresponding coupling interconnections 42 on the IC arrangement surface 11c, and the flip chip bonding apparatus detects the load thereof, a predetermined load is applied to each of the bump members, and at the same time, an ultrasonic wave is applied thereto to bond the bump members 46 and the corresponding coupling interconnections 42 to each other. The condition of the ultrasonic wave is set as the power of the ultrasonic wave and the time for which the ultrasonic wave is applied. Further, appropriate heat is also required for the bonding. For example, predetermined heat (e.g., 150° C. through 200° C.) is applied to the package 15 in advance. Further, substantially the same heat is also applied to the package 15 during the ultrasonic processing.

Then, the resonator 20 is coupled and fixed to the coupling interconnections 41 on the resonator support surface of the package 15 with an electrically-conductive adhesive. Then, an annealing treatment is performed at high temperature on the whole of the package 15 in which the IC 50 and the resonator 20 are disposed including curing of the electrically-conductive adhesive. This also provides an advantage of removing an outgas from the electrically-conductive adhesive, the package 15, and so on. Then, the lid 16 made of metal is aligned with and fixed to the seam ring 14 of the package 15 and is then airtightly sealed using seam weld.

In such a manner, the oscillator 1 is manufactured.

(2) Second Embodiment (2-1) Configuration of Oscillator:

An oscillator 1a according to the present embodiment will be described. The oscillator 1a according to the present embodiment is substantially the same as the oscillator 1 according to the first embodiment except the fact that the positions of the second pad group (the pads 51e, 51f) in the IC 50, and the shapes of the coupling interconnections 42 in the IC arrangement surface 11c are different. The point in which the oscillator 1a and the oscillator 1 are different will be described.

Figure 6:
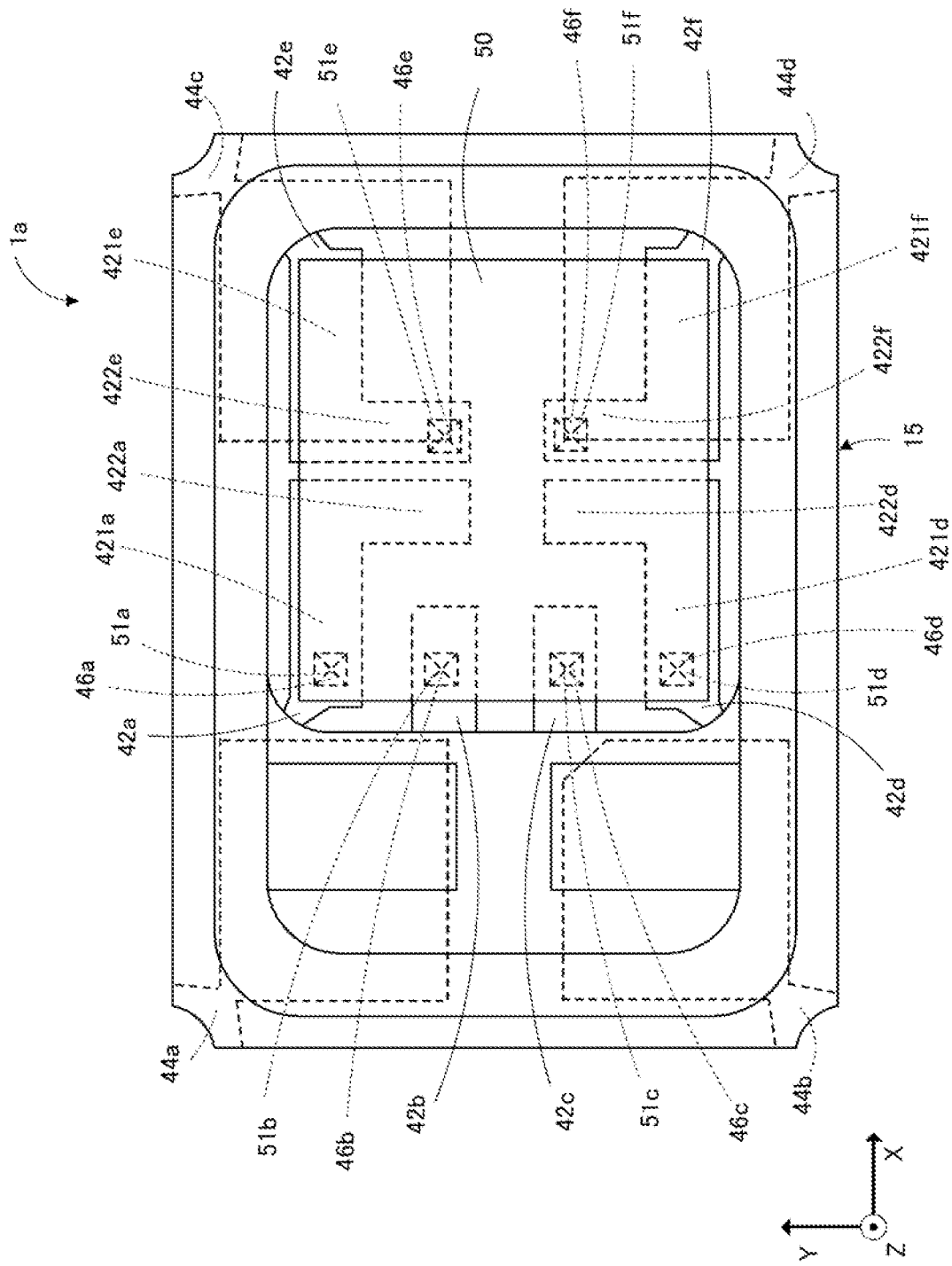
FIG. 6 is a see-through plan view of an oscillator.

FIG. 6 is a plan view of the oscillator 1a seen through the lid 16 and the resonator 20.

In the coupling interconnection 42a in the present embodiment, the first portion 421a further extends rightward compared to the coupling interconnection 42a in the first embodiment. Further, the coupling interconnections 42b, 42c in the present embodiment are substantially the same as the coupling interconnections 42b, 42c in the first embodiment. Further, in the coupling interconnection 42d in the present embodiment, the third portion 421d further extends rightward compared to the coupling interconnection 42d in the first embodiment.

Further, in the coupling interconnection 42e in the present embodiment, the fifth portion 421e further extends leftward compared to the coupling interconnection 42e in the first embodiment. Further, the sixth portion 422e does not overlap the external terminal 44c at the left side, but overlaps the external terminal 44c at the right side, and a frontward end portion of the sixth portion 422e is located at the front side of a frontward end portion of the external terminal 44c.

Further, in the coupling interconnection 42f in the present embodiment, the seventh portion 421f further extends leftward compared to the coupling interconnection 42f in the first embodiment. Further, the eighth portion 422f does not overlap the external terminal 44d at the left side, but overlaps the external terminal 44d at the right side, and a backward end portion of the eighth portion 422f is located at the back side of a backward end portion of the external terminal 44d.

The arrangement positions of the first pad group (the pads 51a through 51d) in the present embodiment are substantially the same as those of the pads 51a through 51d in the first embodiment. The pad 51e in the present embodiment is disposed at a position on the coupling interconnection 42e, and at a position in the vicinity of the frontward end portion of the sixth portion 422e of the coupling interconnection 42e in the plan view. As shown in FIG. 6, the pad 51e does not partially overlap the external terminal 44c. Therefore, the bump member 46e is disposed at a position where the bump member 46e does not partially overlap the external terminal 44c.

Further, the pad 51f in the present embodiment is disposed at a position on the coupling interconnection 42f, and at a position in the vicinity of the backward end portion of the eighth portion 422f of the coupling interconnection 42f in the plan view. As shown in FIG. 6, the pad 51f does not partially overlap the external terminal 44d. Therefore, the bump member 46f is disposed at a position where the bump member 46f does not partially overlap the external terminal 44d.

As described hereinabove, according to the configuration in the present embodiment, in the oscillator 1a, the pads 51a through 51d do not even partially overlap any of the external terminals 44 in the plan view, and the pads 51a through 51d do not partially overlap the external terminals 44 in the plan view. Therefore, the imbalance in height of the arrangement positions of the pads 51a through 51f on the IC arrangement surface 11c is reduced compared to when some of the plurality of pads of the IC completely overlap the external terminals 44, and the rest of the pads do not even partially overlap the external terminals 44 as in the oscillator 2. Thus, the pressure applied to the periphery of each of the pads 51a through 51f when bonding the IC 50 and the package 15 to each other using the flip chip bonding becomes more approximate to the uniform pressure. As a result, it is possible to reduce the possibility that an excessive pressure is applied to the periphery of some of the pads 51a through 51f to deteriorate the performance of the IC 50.

(2-2) Method of Manufacturing Oscillator:

A method of manufacturing the oscillator 1a will be described.

First, the bump members 46 are formed on the respective pads 51 of the IC 50 using substantially the same method as the method of manufacturing the oscillator 1 according to the first embodiment.

Then, the IC 50 is flipped, and is passed to the tip nozzle of the ultrasonic horn of the flip chip bonding apparatus. Then, using the flip chip bonding apparatus, the surface of the IC 50 on which the pads 51 are disposed is made opposed in parallel to the IC arrangement surface 11c of the package 15 disposed horizontally with the mounting surface located in the bottom part. On this occasion, it is arranged that each of the pads 51a through 51f does not even partially overlap any of the external terminals 44 in the plan view. Further, it is arranged that the pad 51e does not partially overlap the external terminal 44c in the plan view. Further, it is arranged that the pad 51f does not partially overlap the external terminal 44d in the plan view. Thus, in the oscillator 1, each of the bump members 46 is located at a position which does not at least partially overlap any of the external terminals 44 in the plan view.

Then, using the flip chip bonding apparatus, the IC is moved downward to come closer to the IC arrangement surface 11c. When the bump members 46 provided to the respective pads 51 of the IC 50 make contact with the corresponding coupling interconnections 42 on the IC arrangement surface 11c, and the flip chip bonding apparatus detects the load thereof, a predetermined load and an ultrasonic wave are applied thereto to bond the bump members 46 and the corresponding coupling interconnections 42 to each other.

Then, using substantially the same method as the method of manufacturing the oscillator 1 according to the first embodiment, the resonator 20 is coupled and then fixed to the coupling interconnections 41, the lid 16 is aligned with and then fixed to the seam ring 14 of the package 15, and is then airtightly sealed with the seam weld.

In such a manner, the oscillator 1a is manufactured.

(3) Third Embodiment

An oscillator 1b according to the present embodiment will be described. The oscillator 1b according to the present embodiment is substantially the same as the oscillator 1a according to the second embodiment except the fact that the shapes of the external terminals 44 are different in the plan view. The point in which the oscillator 1b and the oscillator 1a are different will be described.

Figure 7:
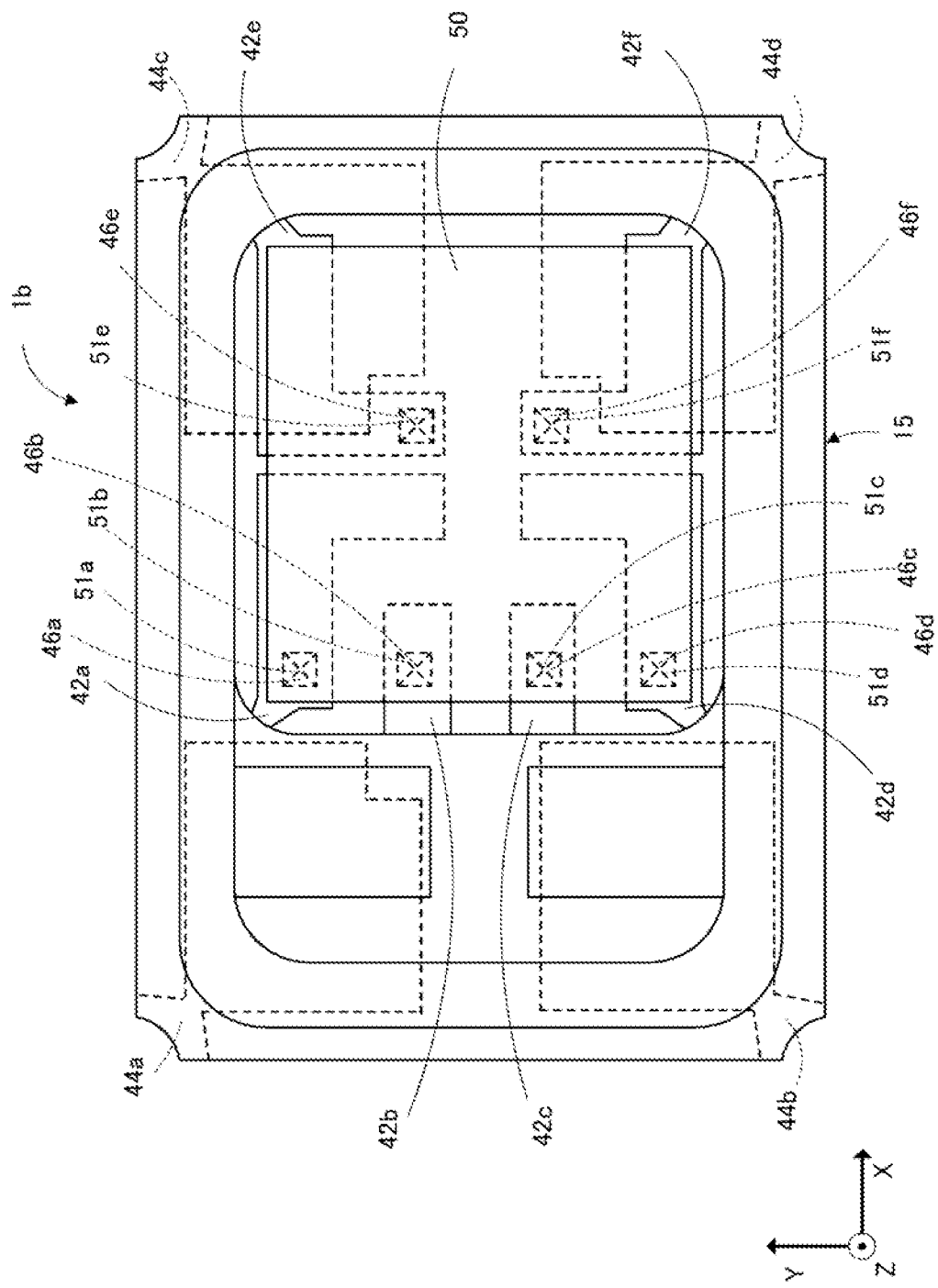
FIG. 7 is a see-through plan view of an oscillator.

FIG. 7 is a plan view of the oscillator 1b seen through the lid 16 and the resonator 20.

The external terminals 44a, 44c, and 44d in the present embodiment have the shapes obtained by cutting out a rectangular area from the external terminals 44a, 44c, and 44d in the first embodiment, respectively. More specifically, the external terminals 44a, 44c, and 44d in the present embodiment have shapes obtained by cutting out predetermined rectangular areas from corner portions closer to the center of the second surface 11b of rectangular areas to form a cutout in the plan view compared to the external terminals 44a, 44c, and 44d in the first embodiment. Thus, compared to the oscillator 1a according to the second embodiment, it is possible to prevent the pads 51e, 51f from even partially overlapping the external terminals 44c, 44d, respectively.

The external terminal 44b has substantially the same shape as those of the external terminals 44a, 44c, and 44d in the first embodiment. As described above, by providing the external terminal 44b with a different shape from those of the external terminals 44a, 44c, and 44d, it is possible for the user to figure out what type of terminal each of the external terminals 44 is. In other words, in the present embodiment, the external terminals 44a, 44c, and 44d each have a shape obtained by cutting out a part of the shape of the external terminal 44b as one of the external terminals 44 which are closer to the first pad group than to the second pad group.

As described hereinabove, due to the configuration of the present embodiment, in the oscillator 1b, the pads 51a through 51f do not even partially overlap any of the external terminals 44 in the plan view. Therefore, the imbalance in height of the arrangement positions of the pads 51a through 51f on the IC arrangement surface 11c is reduced. Thus, the pressure applied to the periphery of each of the pads 51a through 51f when bonding the IC 50 and the package 15 to each other using the flip chip bonding becomes more approximate to the uniform pressure. As a result, it is possible to reduce the possibility that an excessive pressure is applied to the periphery of some of the pads 51a through 51f to deteriorate the performance of the IC 50.

Figure 8:
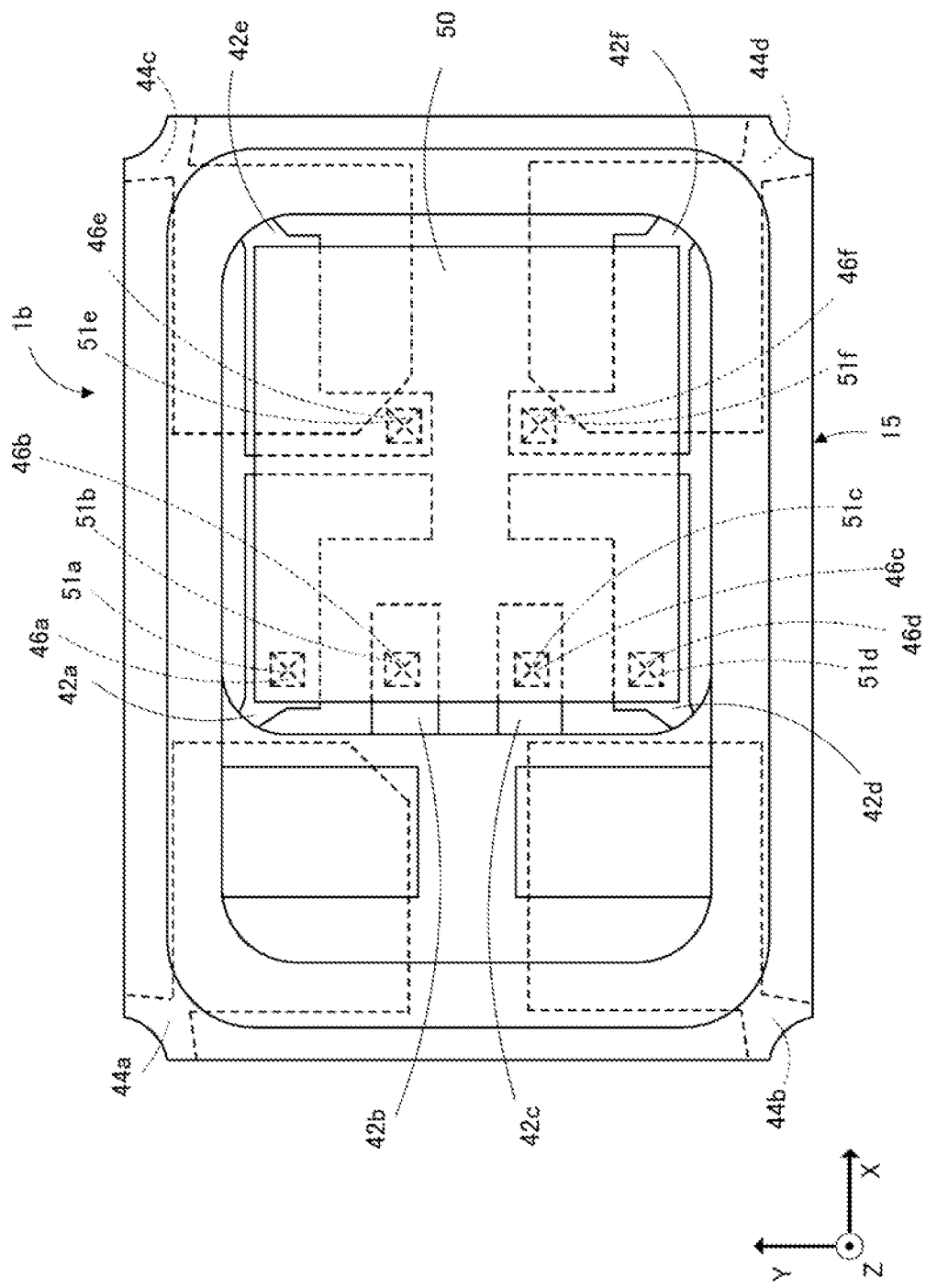
FIG. 8 is a see-through plan view of an oscillator.

Further, the shapes of the external terminals 44a, 44c, and 44d in the present embodiment are not limited to such shapes as shown in FIG. 7, and are only required to be the shapes obtained by cutting out a part of the shapes of the external terminals 44a, 44c, and 44d in the first embodiment, respectively, so as not to overlap the pads 51. For example, it is possible for the shapes of the external terminals 44a, 44c, and 44d in the present embodiment to have shapes obtained by cutting out corner portions closer to the center of the second surface 11b from the rectangular areas in the plan view as shown in FIG. 8 compared to the external terminals 44a, 44c, and 44d in the first embodiment.

Further, it is assumed that the external terminals 44a, 44c, and 44d in the present embodiment all have the shapes obtained by cutting out a part from the external terminals 44a, 44c, and 44d in the first embodiment, respectively. It should be noted that since the second pad group is higher in possibility of overlapping the external terminals 44 than the first pad group, it is possible to assume that at least the external terminals 44 (44c, 44d) which are closer to the second pad group than to the first pad group out of the external terminals 44 are provided with the shapes obtained by cutting out a part from the external terminals 44c, 44d in the first embodiment, respectively, and the external terminals 44 which are closer to the first pad group than to the second pad group are substantially the same as in the first embodiment.

Further, the method of manufacturing the oscillator 1b is substantially the same as the method of manufacturing the oscillator 1 according to the first embodiment except the point that the external terminals 44 in the present embodiment are used.

(4) Other Embodiments

The embodiments described hereinabove are each an example for implementing the present disclosure. Besides the above, it is possible to adopt a variety of embodiments of adjusting at least one of the positions of the pads 51 in the IC 50, and the positions or the shapes of the external terminals 44 to arrange that each of the pads 51 does not at least partially overlap the external terminal 44.

In each of the embodiments described above, it is assumed that the pads 51a through 51f play roles of the power supply pad, the first resonator pad, the second resonator pad, the control pad, the ground pad, and the output pad, respectively. It should be noted that it is also possible to assume that the pads 51a through 51f each play a different role. For example, the pad 51a can be the control pad, and the pad 51d can be the power supply pad. Further, it is possible for the coupling interconnections 42a through 42f and the external terminals 44a through 44f to play roles different from those in each of the embodiments described above in accordance with the roles of the pads 51a through 51f, respectively.

Further, in each of the embodiments described above, it is assumed that the quartz crystal resonator is used as the resonator 20. It should be noted that it is possible to assume that a different type of resonator such as a ceramic resonator is used as the resonator 20.

Further, in each of the embodiments described above, it is assumed that each of the pads 51 does not at least partially overlap the external terminal 44. The portion overlapping the external terminal 44 in the plan view on the IC arrangement surface 11c becomes higher than the periphery. Further, regarding a portion not overlapping the external terminal 44 in the plan view on the IC arrangement surface 11c, the closer to the external terminal 44 it is located, the higher it becomes, and the farther from the external terminal 44 it is located, the lower it becomes due to an influence of the external terminal 44. Therefore, by setting the arrangement positions of the pads 51 within a range in which the distance from the external terminals 44 is equal to or shorter than a predetermined distance in the plan view, it is possible to further reduce the imbalance in height of the arrangement positions of the pads 51a through 51f on the IC arrangement surface 11c. The distance mentioned here is the shortest distance between an outer edge of the external terminal 44 and an outer edge of the pad 51. Therefore, when a part of the pad 51 overlaps the external terminal 44, the distance between the external terminal 44 and the pad 51 becomes 0. As the predetermined distance, there are cited, for example, a distance twice as large as the width of the pad 51 and a distance three times as large as the width of the pad 51.

Further, in each of the embodiments described above, it is assumed that the four pads 51 (51a through 51d) are included in the first pad group, and the two pads 51 (51e and 51f) are included in the second pad group. It should be noted that the numbers of the pads 51 included in the first pad group and the second pad group are not limited thereto. For example, it is possible to assume that three pads 51 are included in each of the first pad group and the second pad group.

Further, in each of the embodiments described above, the pads 51 included in the second pad group are closer to the external terminals 44 in the plan view compared to the pads 51 included in the first pad group, and are therefore apt to overlap the external terminals 44, and are apt to cause a variation in height due to the external terminals 44. Therefore, by making the number of the pads 51 included in the first pad group larger than the number of the pads 51 included in the second pad group, it is possible to reduce the number of the pads 51 which become higher in arrangement position due to the influence of the external terminals 44.

Further, in each of the embodiments described above, a majority of the pads 51 do not even partially overlap the external terminals 44 in the plan view. As described above, by arranging that a majority of the pads 51 do not even partially overlap the external terminals 44 in the plan view, it is possible to reduce the number of the pads 51 which rise in arrangement position due to the influence of the external terminals 44.

It is sufficient for the external terminals and the package to be arranged that a part of the surface on which the circuit element is disposed in the package overlaps the external terminals.

It is sufficient for the circuit element to have a configuration in which each of the pads can be arranged so as not to even partially overlap the external terminal in the plan view.

It is sufficient for the predetermined distance to be decided based on a measurement result obtained by measuring correspondence between a distance from an outer edge of the external terminal in the plan view and a variation in height on the surface on which the circuit element is disposed in the package.

It is sufficient for the predetermined shape to be a shape in the plan view of the member used as the external terminal. For example, it is sufficient for the predetermined shape to be a shape in the plan view of an existing member used as the external terminal.

What is claimed is:

1. An oscillator comprising:
   a package having a plurality of external terminals disposed on a mounting surface, the package being in a rectangular shape in a plan view and having a first side, a second side as an opposite side to the first side, a third side, and a fourth side as an opposite side to the third side in the plan view;
   a circuit element housed in the package, the circuit element being in a rectangular shape in the plan view and having a fifth side located beside the first side, a sixth side which is an opposite side to the fifth side, and is located farther from the first side than the fifth side, a seventh side, and an eighth side as an opposite side to the seventh side in the plan view; and
   a resonator which is housed in the package, and is electrically coupled to the circuit element, wherein
   the circuit element is electrically coupled to the package with a plurality of pads which are bonded to the package via a plurality of bump members, respectively,
   the circuit element overlaps at least one of the plurality of external terminals in the plan view,
   each of the plurality of bump members is bonded to the package at a position where at least a part of the plurality of bump members does not overlap the plurality of external terminals in the plan view,
   the plurality of pads includes a first pad group disposed along the fifth side so as to be closer to the fifth side than to the sixth side, and a second pad group disposed along the sixth side so as to be closer to the sixth side than to the fifth side,
   a distance between the first side and the fifth side is longer than a distance between the second side and the sixth side, and
   a distance between the sixth side and the second pad group is longer than a distance between the fifth side and the first pad group.

2. The oscillator according to claim 1, wherein
   the number of pads included in the first pad group is larger than the number of pads included in the second pad group.

3. The oscillator according to claim 1, wherein
the external terminal located closer to the second pad group than to the first pad group out of the plurality of external terminals has a shape obtained by cutting out a part from a predetermined shape so as not to overlap at least the part of the plurality of bump members in the plan view.

4. The oscillator according to claim 3, wherein
the predetermined shape is a shape of one of the plurality of external terminals located closer to the first pad group than to the second pad group.

5. The oscillator according to claim 1, wherein
a majority of the plurality of pads do not even partially overlap the plurality of external terminals.

6. The oscillator according to claim 1, wherein
the plurality of pads includes
　a power supply pad to which a power supply voltage is applied,
　a ground pad supplied with a ground potential,
　a first resonator pad to be electrically coupled to the resonator,
　a second resonator pad to be electrically coupled to the resonator,
　an output pad configured to output a clock signal, and
　a control pad to which an output control signal for the clock signal is input.

7. The oscillator according to claim 1, wherein
the first pad group includes
　a power supply pad to which a power supply voltage is applied,
　a first resonator pad to be electrically coupled to the resonator,
　a second resonator pad to be electrically coupled to the resonator, and
　a control pad to which an output control signal for the clock signal is input,
the second pad group includes
　a ground pad supplied with a ground potential, and
　an output pad configured to output a clock signal, and
the plurality of external terminals includes
　a power supply terminal and a control terminal disposed closer to the first side than to the second side, and
　a ground terminal and an output terminal disposed closer to the second side than to the first side.

8. The oscillator according to claim 7, wherein
the package includes a power supply interconnection electrically coupled to the power supply pad, and
the power supply interconnection includes
　a first portion configured to couple the power supply pad and the power supply terminal to each other, and
　a second portion extending between the output pad and the first resonator pad in the plan view.

9. The oscillator according to claim 7, wherein
the package includes a control interconnection electrically coupled to the control pad, and
the control interconnection includes
　a third portion configured to couple the control pad and the control terminal to each other, and
　a fourth portion extending between the ground pad and the second resonator pad in the plan view.

10. A method of manufacturing an oscillator, the oscillator including,
　a package having a plurality of external terminals disposed on a mounting surface, the package being in a rectangular shape in a plan view and having a first side, a second side as an opposite side to the first side, a third side, and a fourth side as an opposite side to the third side in the plan view;
　a circuit element housed in the package, the circuit element being in a rectangular shape in the plan view and having a fifth side located beside the first side, a sixth side which is an opposite side to the fifth side, and is located farther from the first side than the fifth side, a seventh side, and an eighth side as an opposite side to the seventh side in the plan view, the circuit element overlapping at least one of the plurality of external terminals in the plan view; and
　a resonator which is housed in the package, and is electrically coupled to the circuit element,
the method comprising:
　a bonding step of bonding each of a plurality of pads provided at the circuit element to the package via a plurality of bump members, respectively, thereby electrically couple the circuit element to the package, wherein
in the bonding step, each of the plurality of bump members is located so that at least a part of the plurality of bump members does not overlap the plurality of external terminals in the plan view,
the plurality of pads includes a first pad group disposed along the fifth side so as to be closer to the fifth side than to the sixth side, and a second pad group disposed along the sixth side so as to be closer to the sixth side than to the fifth side,
a distance between the first side and the fifth side is longer than a distance between the second side and the sixth side, and
a distance between the sixth side and the second pad group is longer than a distance between the fifth side and the first pad group.

* * * * *